(12) United States Patent
Chen

(10) Patent No.: US 7,282,788 B2
(45) Date of Patent: Oct. 16, 2007

(54) IMAGE SENSING CHIP PACKAGE STRUCTURE

(75) Inventor: Po-Hung Chen, Shin-Chu (TW)

(73) Assignee: Sigurd Microelectronics Corp., Shin-Chu (TW)

( * ) Notice: Subject to any disclaimer, the term of this patent is extended or adjusted under 35 U.S.C. 154(b) by 120 days.

(21) Appl. No.: 11/225,078

(22) Filed: Sep. 14, 2005

(65) Prior Publication Data

US 2007/0057356 A1  Mar. 15, 2007

(51) Int. Cl.
*H01L 23/02* (2006.01)
(52) U.S. Cl. ............... 257/680; 257/704; 257/E31.095
(58) Field of Classification Search ............... 257/680, 257/704, E31.095
See application file for complete search history.

(56) References Cited

U.S. PATENT DOCUMENTS

| | | | |
|---|---|---|---|
| 6,483,030 B1 * | 11/2002 | Glenn et al. | 174/521 |
| 6,531,784 B1 * | 3/2003 | Shim et al. | 257/777 |
| 7,005,720 B2 * | 2/2006 | Huang et al. | 257/433 |

* cited by examiner

*Primary Examiner*—Phat X. Cao
(74) *Attorney, Agent, or Firm*—Rosenberg, Klein & Lee

(57) ABSTRACT

In an image sensing chip package structure, plated through vias penetrate a substrate to electrically connect metallization traces disposed on the upper and lower surfaces of the substrate. The plated through vias can be opened from the center of the substrate instead of being located at the periphery of the substrate. Contamination can thus be avoided during the glue dispensing process, and protection layers can also be used to seal gaps generated by the plated through vias, hence enhancing the producing yield. Moreover, protection layers having stickiness can further be used to secure components so as to reduce the production cost and enhance the product quality.

11 Claims, 4 Drawing Sheets

IMAGE SENSING CHIP PACKAGE STRUCTURE

BACKGROUND OF THE INVENTION

1. Field of the Invention

The present invention relates to an image sensing chip package structure and, more particularly, to an image sensing chip package structure capable of enhancing the production yield.

2. Description of Related Art

As shown in FIG. 1, a conventional CMOS image sensor package structure comprises a substrate 10, an image sensing chip 20, a housing 30, and a lens barrel 40. Several metallization traces 11 are distributed on upper and lower surfaces of the substrate 10. The metallization traces 11 are electrically connected together by plated through vias 12 at two sides of the substrate 10. The image sensing chip 20 has an image sensing area 21. The image sensing chip 20 is fixed on the substrate 10, and is electrically connected to the substrate 10 through the metallization traces 11 by wire bonding. The housing 30 formed by injection molding is adhered to the substrate 10 to enclose the image sensing chip 20. The lens barrel 40 is sleeved in the housing 30, and includes a through hole 41 and an aspheric lens 42. The through hole 41 is unobstructed to a light source so that the light source can pass the aspheric lens 41 and be transmitted to the image sensing chip 20 for imaging.

The above conventional package structure, however, has a primary drawback: glue will flow to the lower surface of the substrate 10 along the plated through vias 12 at the edge sides of the substrate 10 when dispensing glue to the housing 30, resulting in contamination of the substrate 10. If the amount of glue is insufficient, there will be gaps in the seal, causing problems in reliability. Therefore, in order to accomplish higher quality and yield, it is necessary to precisely control the amount of applied glue between the plated through vias 12 and the seal of the housing 30, hence increasing the complexity of the packaging process and the production cost.

SUMMARY OF THE INVENTION

An object of the present invention is to provide an image sensing chip package structure, in which a plated through via penetrates a substrate instead of being disposed at the periphery of the substrate, hence avoiding contamination caused by the glue dispensing process. Moreover, a protection layer is used to seal gaps generated by the plated through hole so as to enhance the process yield and solve the problems in the prior art.

Another object of the present invention is to provide an image sensing chip package structure, in which a plated through via is disposed at a position corresponding to an image sensing chip, and a protection layer is used to cover gaps generated by the plated through hole. This protection layer also assists in adhering the image sensing chip to the substrate to ensure the product quality and reduce the production cost.

Another object of the present invention is to provide an image sensing chip package structure, in which a plated through via is disposed at a position corresponding to a lens barrel, and a protection layer is used to cover gaps generated by the plated through hole. This protection layer also assists in adhering the lens barrel to the substrate to ensure the product quality and reduce the production cost.

To achieve the above objects, the present invention proposes an image sensing chip package structure, which comprises a substrate, a protection layer, an image sensing chip, a housing, and a lens barrel. Several metallization traces are accommodated on an upper surface and a lower surface of the substrate. At least one plated through via penetrates between the upper surface and the lower surface of the substrate. The metallization traces are electrically connected together by the plated through via. The protection layer is disposed on the upper surface of the substrate to cover the plated through via for preventing the plated through via from generating gaps to affect the product quality. The image sensing chip is installed on the substrate and electrically connected to the substrate by the metallization traces. A lens and a through hole are disposed on a central line of the housing. The lens can receive a light source via the through hole. The housing is a hollow body with two open ends, is installed on the substrate, and encloses the image sensing chip. The lens barrel is movably sleeved in the housing. The housing is used to protect and guide or assist in guiding the lens barrel to make relative distance adjustment with respect to the image sensing chip so as to focus for imaging.

The plated through via can be located at a position on the substrate corresponding to the housing, and a protection layer having stickiness can be adopted to adhere the housing to the substrate. Or the plated through hole can be located at a position on the substrate corresponding to the image sensing chip, and the protection layer can adhere the image sensing chip to the substrate. The present invention can not only avoid glue contamination during the packaging process to enhance the production yield and ensure the product quality, but the present invention can also reduce the production cost.

Besides, in the image sensing chip package structure of the present invention, the plated through via can be opened at the center of the upper surface of the substrate so that the plated through hole is fully enclosed by the substrate instead of being located at the periphery of the substrate, thereby avoiding contamination during the glue dispensing process. The image sensing chip package structure comprises a substrate, an image sensing chip, a housing, and a lens barrel. Several metallization traces are accommodated on an upper surface and a lower surface of the substrate. The metallization traces are electrically connected together by the plated through via. The image sensing chip is installed on the upper surface of the substrate and electrically connected to the substrate by the metallization traces. A lens and a through hole are disposed on a central line of the housing. The lens can receive a light source via the through hole. The housing is a hollow body with two open ends, is installed on the substrate, and encloses the image sensing chip. The lens barrel is movably sleeved in the housing. The housing is used to protect and guide or assist in guiding the lens barrel to make relative distance adjustment with respect to the image sensing chip so as to focus for imaging.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
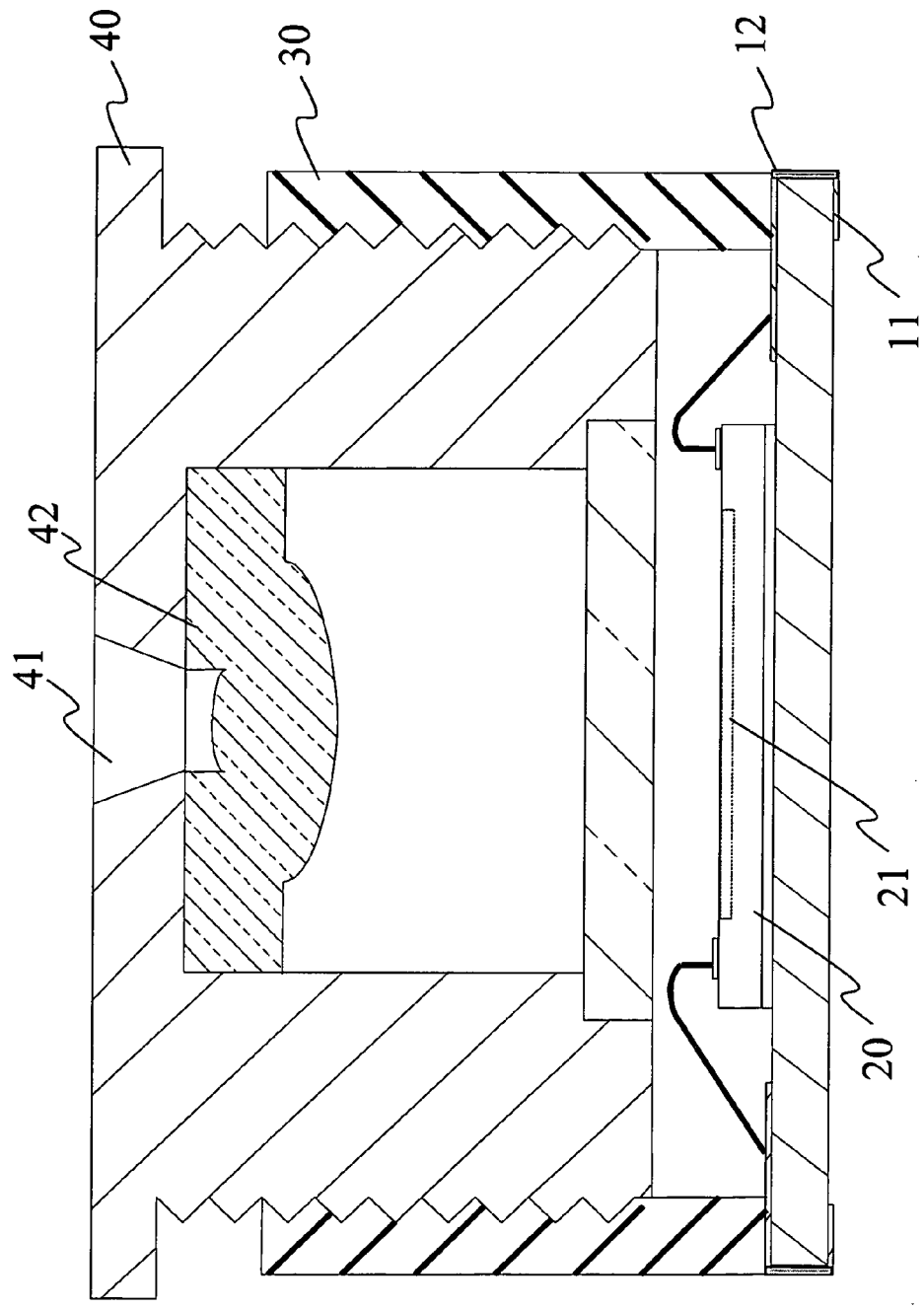
FIG. 1 is a diagram of a conventional image sensing chip package structure.
Figure 2:
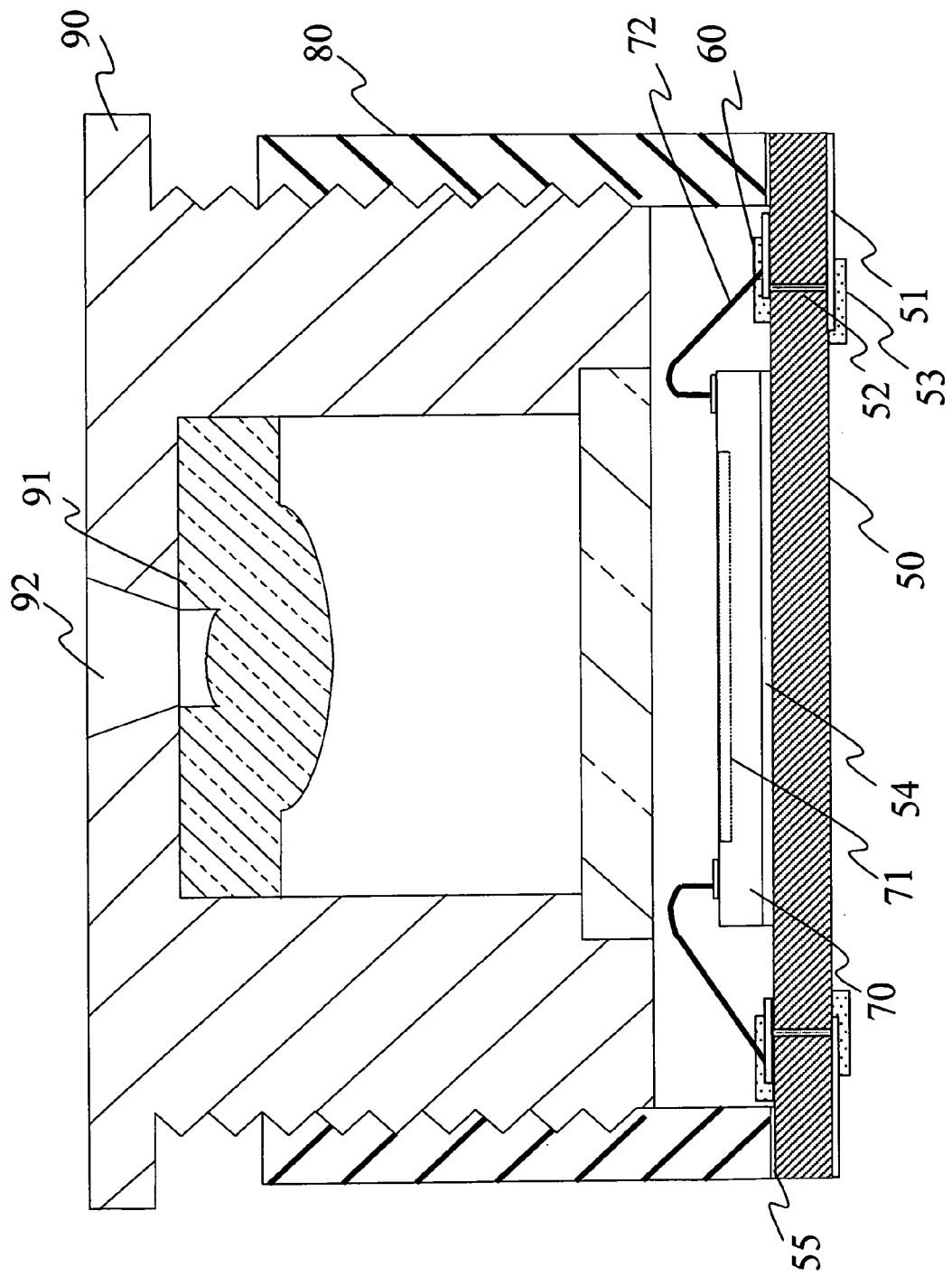
FIG. 2 is a diagram of an image sensing chip package structure according to a first embodiment of the present invention.

FIG. 2 is a diagram of an image sensing chip package structure according to a first embodiment of the present invention. As shown in FIG. 2, an image sensing chip package structure of the present invention comprises a substrate 50, a protection layer 60, an image sensing chip 70, a housing 80, and a lens barrel 90. Several metallization traces 51 are accommodated on an upper surface and a lower surface of the substrate 50. A plated through via 52 penetrates between the upper surface and lower surface of the substrate 50. The metallization traces 51 are electrically connected together by the plated through via 52. The protection layer 60 can be selected among solder mask, thermosetting glue, silver paste, and double-sided glue. The protection layer 60 is disposed on the upper surface of the substrate 50 and covers the plated through via 52 to seal gaps formed by the plated through via 52. The image sensing chip 70 is installed on the substrate 50, and has an image sensing area 71 on its surface. Bonding wires 72 are connected to the metallization traces 51 by wire bonding to electrically connect the image sensing chip 70 to the substrate 50. The lens barrel 90 has a lens 91 and a through hole 92. The through hole 92 penetrates the front end of the lens barrel 90 to be unobstructed to a light source. The lens 91 can receive the light source via the through hole 92 to focus and then transmit the light source to the image sensing chip 70. The housing 80 is a hollow body with two open ends, and is installed above the substrate 50, and encloses the image sensing chip 70. Besides, the lens barrel 90 is movably sleeve in the housing 80. The housing 80 can protect and guide or assist in guiding the lens barrel 90 to make relative distance adjustment with respect to the image sensing chip 70 so as to change the imaging effect of the light source.

In this embodiment, a glue layer 53 can be used on the lower surface of the substrate 50 to cover the plated through via 52 so as to prevent the plated through via 52 from generating gaps. The glue layer 53 can be solder mask or thermosetting glue. Besides, the upper surface of the substrate 50 can include a first adhesion layer 54 to adhere the image sensing chip 70 to the substrate 50. The upper surface of the substrate 50 can further include a second adhesion layer 55 to adhere the housing 80 to the substrate 50. The material of the first and second adhesion layers 54 and 55 can be thermosetting glue.

Different from the prior art, the present invention provides a higher reliability and a higher production yield. The plated through via penetrates the substrate instead of being disposed at two sides of the substrate, hence avoiding contamination during the glue dispensing process. Moreover, a protection layer is used to prevent the plated through hole from generating gaps. The protection layer in the present invention can have stickiness to produce a securing function. Therefore, the protection layer can have double effects by changing the position of the plated through via, hence enhancing the product yield and reducing the production cost.

Figure 3:
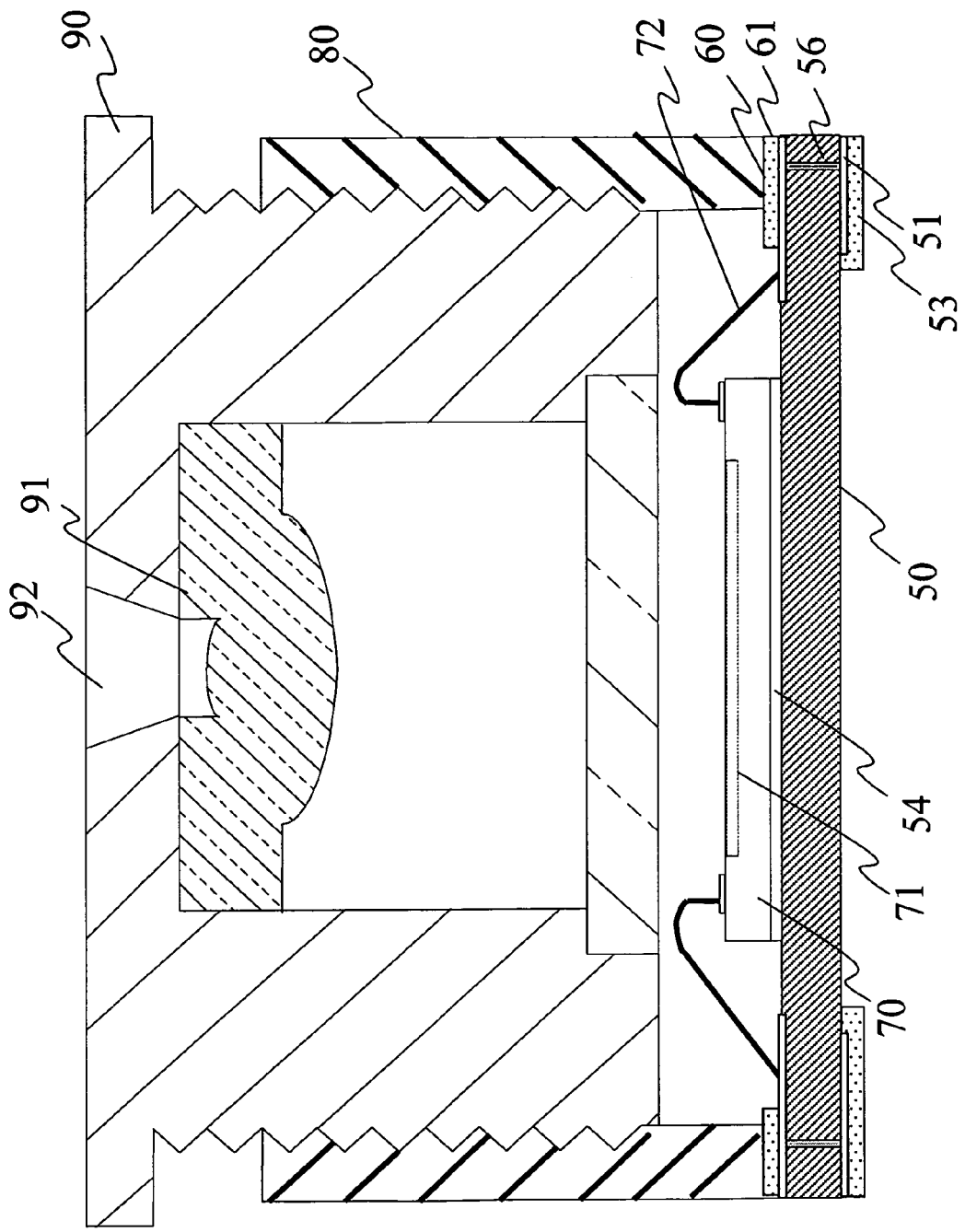
FIG. 3 is a diagram of an image sensing chip package structure according to a second embodiment of the present invention.

FIG. 3 is a diagram of an image sensing chip package structure according to a second embodiment of the present invention. As shown in FIG. 3, a plated through via 56 is disposed at a position on the substrate 50 corresponding to the housing 80. A protection layer 61 covers the plated through via 56 to seal gaps generated by the plated through via 56. The protection layer 61 is formed of material having stickiness such as thermosetting glue, and thus can adhere the housing 80 to the substrate 50.

Figure 4:
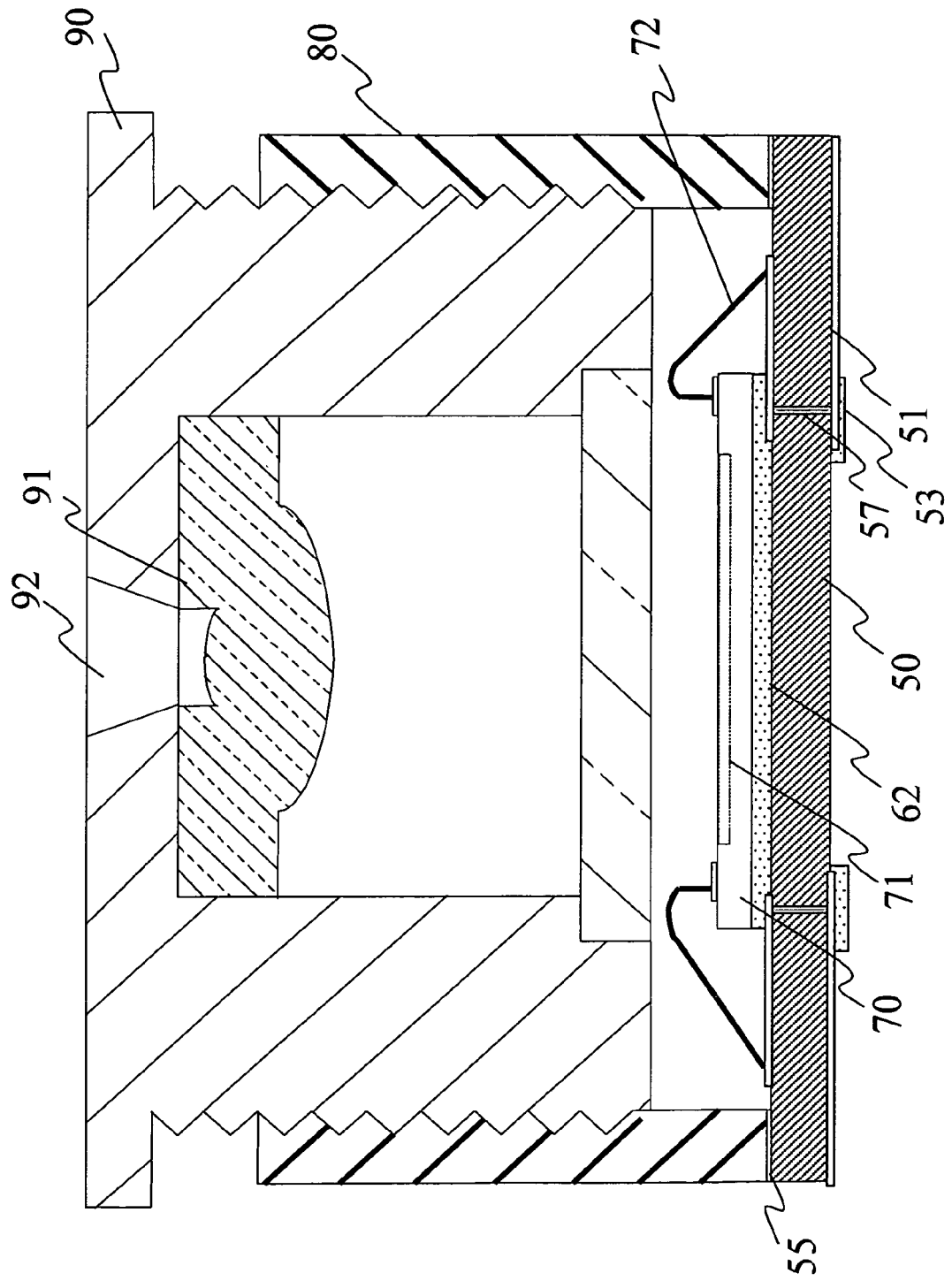
FIG. 4 is a diagram of an image sensing chip package structure according to a third embodiment of the present invention.

FIG. 4 is a diagram of an image sensing chip package structure according to a third embodiment of the present invention. As shown in FIG. 4, a plated through via 57 is disposed at a position on the substrate 50 corresponding to the image sensing chip 70. A protection layer 62 covers the plated through via 57 to seal gaps generated by the plated through via 57. The protection layer 62 is formed of material having stickiness such as silver paste or double-sided glue, and thus can adhere the image sensing chip 70 to the substrate 50.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. An image sensing chip package structure comprising:
   a substrate with a plurality of metallization traces on an upper surface and a lower surface thereof, at least one plated through via penetrating between said upper surface and said lower surface, said metallization traces being electrically connected together by said plated through via;
   a protection layer disposed on said upper surface of said substrate to cover said plated through via, said protection layer being made of a material selected from the group consisting of: thermosetting glue and silver paste;
   a thermosetting glue layer positioned on said lower surface of said substrate and covering said at least one plated through via;
   an image sensing chip installed on said substrate and electrically connected with said substrate by said metallization traces;
   a housing being a hollow body with two open ends, said housing being installed on said substrate and enclosing said image sensing chip; and
   a lens barrel movably sleeved in said housing to make relative motion with respect to said image sensing chip, said lens barrel having at least one lens and one through hole, said through hole being unobstructed to a light source so that said lens can receive said light source.

2. The image sensing chip package structure of claim 1, wherein said plated through via is located at a position on said substrate corresponding to said housing, and said protection layer can adhere said housing to said substrate.

3. The image sensing chip package structure of claim 1, wherein said plated through via is located at a position on said substrate corresponding to said image sensing chip, and said protection layer can adhere said image sensing chip to said substrate.

4. The image sensing chip package structure of claim 1, wherein said substrate further comprises a first adhesion layer for adhering said image sensing chip to said substrate.

5. The image sensing chip package structure of claim 1, wherein said substrate further comprises a second adhesion layer for adhering said housing to said substrate.

6. The image sensing chip package structure of claim 1, wherein said image sensing chip is connected to said metallization traces via more than one bonding wire to be electrically connected to said substrate.

7. An image sensing chip package structure comprising:
- a substrate with a plurality of metallization traces on an upper surface and a lower surface thereof, at least one plated through via being opened at a center of said upper surface so that said plated through via is fully enclosed by said substrate, said metallization traces being electrically connected together by said plated through via;
- an image sensing chip installed on said substrate and electrically connected with said substrate by said metallization traces, said at least one plated through via being located at a position on said substrate corresponding to said image sensing chip;
- a protection layer formed between said upper surface of said substrate and said image sensing chip to cover said at least one plated through via, said protection layer being made of a material selected from the group consisting of: thermosetting glue and silver paste;
- a thermosetting glue layer formed on said lower surface of said substrate and covering said at least one plated through via;
- a housing being a hollow body with two open ends, said housing being installed on said substrate and enclosing said image sensing chip; and
- a lens barrel movably sleeved in said housing to make relative motion with respect to said image sensing chip, said lens barrel having at least one lens and one through hole, said through hole being unobstructed to a light source so that said lens can receive said light source.

8. The image sensing chip package structure of claim 7, wherein said substrate further comprises a second adhesion layer for adhering said housing to said substrate.

9. The image sensing chip package structure of claim 7, wherein said lower surface of said substrate further includes a glue layer to cover said plated through via.

10. The image sensing chip package structure of claim 9, wherein said glue layer is solder mask or thermosetting glue.

11. The image sensing chip package structure of claim 10, wherein said image sensing chip is connected to said metallization traces via more than one bonding wire to be electrically connected to said substrate.

* * * * *